(12) United States Patent
Chung (10) Patent No.: US 12,210,382 B2
(45) Date of Patent: Jan. 28, 2025

(54) ELECTRONIC DEVICE, EXTERNAL ELECTRONIC COMPONENT AND ASSEMBLY METHOD THEREOF

(71) Applicant: GETAC TECHNOLOGY CORPORATION, New Taipei (TW)

(72) Inventor: Chia-Lung Chung, Taipei (TW)

(73) Assignee: Getac Technology Corporation, New Taipei (TW)

( * ) Notice: Subject to any disclaimer, the term of this patent is extended or adjusted under 35 U.S.C. 154(b) by 408 days.

(21) Appl. No.: 17/588,163

(22) Filed: Jan. 28, 2022

(65) Prior Publication Data

US 2022/0302638 A1    Sep. 22, 2022

Related U.S. Application Data

(60) Provisional application No. 63/163,597, filed on Mar. 19, 2021.

(51) Int. Cl.
*G06F 1/16* (2006.01)
*H01R 13/52* (2006.01)
*H01R 33/965* (2006.01)
*H01R 43/00* (2006.01)
*H05K 5/00* (2006.01)

(52) U.S. Cl.
CPC .......... *G06F 1/1632* (2013.01); *G06F 1/1624* (2013.01); *H01R 33/965* (2013.01); *H01R 43/005* (2013.01); *H05K 5/0069* (2013.01); *H01R 13/5219* (2013.01); *H05K 5/0052* (2013.01)

(58) Field of Classification Search
CPC ................. G06F 1/1632; G06F 1/1624; G06F 2200/1639; G06F 1/1607; G06F 1/1613; G06F 1/182; H01R 33/965; H01R 43/005; H01R 13/5219; H05K 5/0069; H05K 5/0052
See application file for complete search history.

(56) References Cited

U.S. PATENT DOCUMENTS

2018/0183177 A1 *  6/2018  Yamanaka  ........... H01R 13/521

FOREIGN PATENT DOCUMENTS

| EP | 2456019 A1 * | 5/2012 | ........... H01R 13/521 |
| EP | 3343706 A2 * | 7/2018 | ........... H01R 13/502 |
| JP | 2018195510 A * | 12/2018 | ........... H01R 13/502 |

* cited by examiner

*Primary Examiner* — Jean F Duverne
(74) *Attorney, Agent, or Firm* — Cooper Legal Group, LLC (57) ABSTRACT

The invention relates to an external assembly component including a body, a housing and a buffer sleeve. The body is provided with a connector. The housing is provided with a notch, and a surrounding wall encircling the notch is erected on an outer side of the housing. The body is accommodated in the housing. The connector passes through the notch toward the outside, the surrounding wall encircles the connector, and the buffer sleeve covers the surrounding wall. Thus, a plug of the connector can be effectively protected from impact and damage, and waterproof and dustproof effects are provided.

20 Claims, 7 Drawing Sheets

ELECTRONIC DEVICE, EXTERNAL ELECTRONIC COMPONENT AND ASSEMBLY METHOD THEREOF

CROSS-REFERENCE TO RELATED APPLICATIONS

The application claims the benefit of a U.S. Provisional Patent Application No. 62/163,597, filed on Mar. 19, 2021, the disclosure of which is hereby incorporated by reference herein in its entirety.

BACKGROUND OF THE INVENTION

Field of the Invention

The present invention relates to an external electronic component, and more particularly to an external electronic component providing effects both protecting a plug of a connector and being waterproof and dustproof.

DESCRIPTION OF THE PRIOR ART

A common external electronic component is detachably installed on an electronic device so as to be replaced and used in response to different needs, and a plug of a connector protruding from the external component is connected to a counterpart connector in the electronic device to thereby achieving an electrical connection for signal transmission.

Since a plug of a connector of a common external electronic component is exposed and protrudes on the outside, when the plug is plugged with a counterpart connector of an electronic device, mutual collision between the two could be caused by any inappropriate angle such that damage is resulted; in other cases, a force produced during an impact would directly act on the plug of the connector and the counterpart connector to cause damage. Moreover, a waterproof or dustproof mechanism is usually not provided between an external electronic component and an electronic device, and so the external electronic component may be likely affected by invasion of moisture or dust such that the lifespan is shortened.

Therefore, on the basis of extensive development with the practice of theories, it is an object of the present invention to provide a solution for effectively improving the issues above in aim of improving and resolving the above issues above.

SUMMARY OF THE INVENTION

It is a primary object of the present invention to provide effects of both protecting a plug of a connector and being waterproof and dustproof.

To achieve the object above, the present invention provides an external electronic component including a body, a housing and a buffer sleeve. The body is provided with a first connector. The housing is provided with a notch, and a surrounding wall encircling the notch and erected on an outer side of the housing. The body is accommodated in the housing. The connector passes through the notch toward the outside, the surrounding wall encircles the first connector, and the buffer sleeve envelops the surrounding wall.

To achieve the object above, the present invention further provides an electronic device including a casing, a mobile latch and an external electronic component. The casing is provided with an accommodating chamber at an outer surface thereof. The mobile latch is movably disposed in the casing and is located on one side of the accommodating chamber. The external electronic component is embedded in the accommodating chamber, and the mobile latch is movable so as to stop the external electronic component. The external electronic component includes a body, a housing and a buffer sleeve. The body is provided with a first connector. The housing is provided with a notch, and a surrounding wall encircling the notch is erected on an outer side of the housing. The body is accommodated in the housing. The connector passes through the notch toward the outside, the surrounding wall encircles the first connector, and the buffer sleeve envelops the surrounding wall.

To achieve the object above, the present invention further provides an assembly method for an external electronic component. The assembly method includes: providing an electronic device, a body and a housing, wherein the electronic device is provided with an accommodating chamber, the accommodating chamber is provided with an insertion hole therein, the insertion hole is provided with a second connector therein, the body is provided with a first connector, and the housing is provided with a notch and a surrounding wall encircling the notch; enveloping the surrounding wall by a buffer sleeve; placing the body in the housing to form an external electronic assembly, and passing the first connector through the notch to enter the encircling wall; and placing the external electronic assembly in the accommodating chamber, such that the surrounding wall is guided by the buffer sleeve and inserted into the insertion hole, and the first connector is connected to the second connector.

To achieve the object above, the present invention further provides an electronic device including a casing, a mobile latch and an external electronic component. The casing is provided with an accommodating chamber at an outer surface thereof, the accommodating chamber is provided with an insertion hole therein, and the insertion hole is provided with a second connector therein. The external electronic component is embedded in the accommodating chamber, and includes a body, a housing and a buffer sleeve. The body is provided with a first connector. The housing is provided with a notch and a surrounding wall corresponding to the first connector, wherein the surrounding wall encircles the notch and the buffer sleeve is adhered to the surrounding wall. When the first connector is connected to the second connector, the buffer sleeve is tightly packed in the insertion hole.

To achieve the object above, the present invention further provides an assembly method for assembling an external electronic component to an electronic device. The assembly method includes: providing an electronic device, a body and a housing, wherein the electronic device is provided with an accommodating chamber, the accommodating chamber is provided with an insertion hole therein, the insertion hole is provided with a second connector therein, the body is provided with a first connector, and the housing is provided with a notch and a surrounding wall encircling the notch; enveloping the surrounding wall by a buffer sleeve; placing the body in the housing to form the external electronic component, and disposing the first connector at the notch; placing one end of the external electronic component away from the first connector in the accommodating chamber and connecting the first connector to the second connector, such that the buffer sleeve is tightly packed in the insertion hole at this point.

The present invention further provides the following effects. By fitting a tenon of the housing in an indentation in the accommodating chamber, the external electronic component is embedded in the accommodating chamber of the electronic device; by stopping the external electronic component with the mobile latch, the external electronic component is prevented from toggling of an external force and hence from disengaging from the accommodating chamber of the electronic device; with a shock-absorbing design of tightly packing the buffer sleeve and the electronic device, the first connector and the second connector are prevented from an instantaneous signal interruption in between when the electronic device receives an impact.

DETAILED DESCRIPTION OF THE EMBODIMENTS

Details and technical contents of the present invention are given with the accompanying drawings below. It should be noted that the accompanying drawings are for illustration purposes and are not to be construed as limitations to the present invention.

Figure 1:
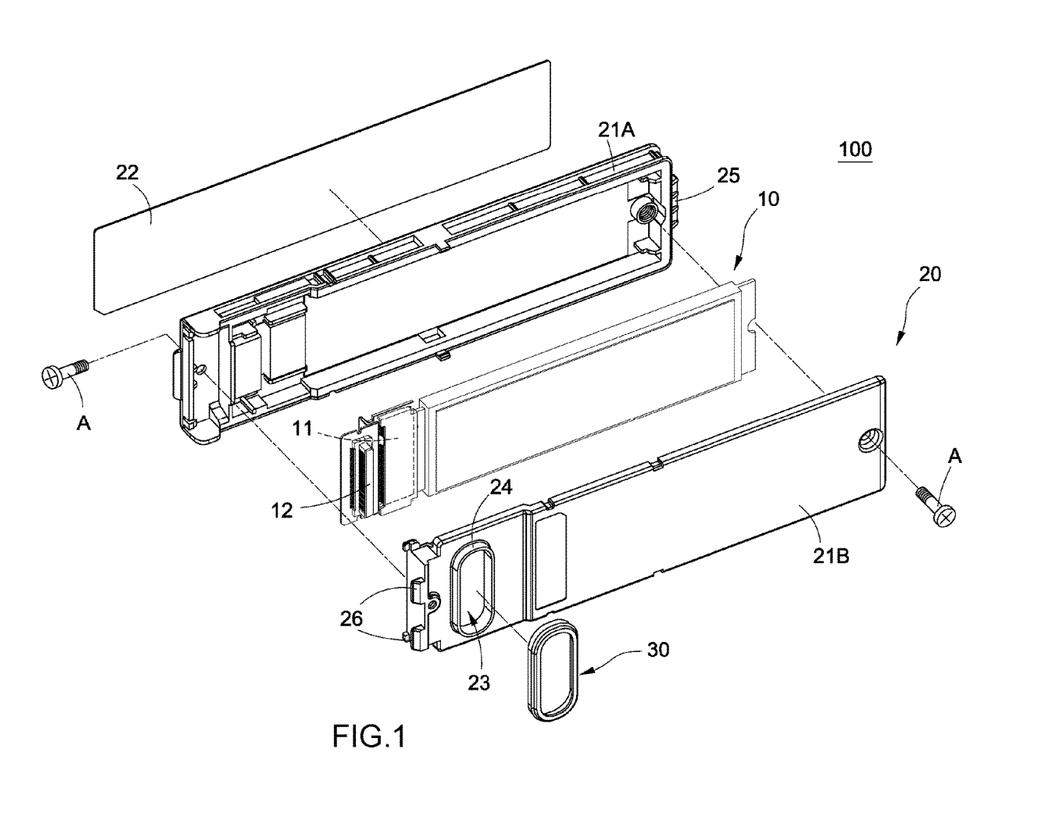
FIG. 1 is an exploded three-dimensional diagram of an external electronic component of the present invention.

Referring to FIG. 1, the present invention provides an external electronic component 100 primarily including a body 10, a housing 20 and a buffer sleeve 30.

In this embodiment, the body 10 includes a circuit board 11, and the body 10 is provided in a protruding manner with a first connector 12 electrically connected to the circuit board 11.

In this embodiment, the housing 20 is formed by enclosing a plastic shell 21A and a metal shell 21B; however, the present invention is not limited to the example above. For example, the two shells may also be both formed of metal elements. Preferably, the plastic shell 21A and the metal shell 21B are locked by at least one screw bolt A, and the housing 20 may further include at least one decorative panel 22 to shield the screw bolt A to give an esthetical look. A notch 23 is provided on one side surface of the housing 20, and a surrounding wall 24 encircling the notch 23 is erected on an outer side of the housing 20. In this embodiment, the notch 23 and the surrounding wall 24 are formed on the metal shell 21B, and the notch 23 may be shaped as an ellipsoid; however, the present invention is not limited to the examples above. For example, the notch 23 may also be shaped as a rectangle. The body 10 is enveloped by the plastic shell 21A and the metal shell 21B and is securely accommodated in the housing 20. The first connector 12 passes through the notch 23 to the outside, and the surrounding wall 24 encircles the first connector 12. Thus, the surrounding wall 24 encircling on the outside of the first connector 12 may first provide protection when the external electronic component 100 is plugged or receives an impact. Moreover, the durability for repeated plugging and unplugging is significantly increased while the first connector 12 is prevented from damage, and the surrounding wall 24 made of a metal material is less likely be deformed by an external force as having better structural strength compared to a plastic material.

In this embodiment, the plastic shell 21A and a tenon 25 are internally formed, the metal shell 21B and the surrounding wall 24 are integrally formed, minute bumps in a micron scale are formed on the metal surface of the surrounding wall 24 by means of chemical microetching, and plastic is filled amid the bumps and cured, thereby achieving secure bonding between the buffer sleeve 30 in a plastic material and the surrounding wall 24 in a metal material by means of an anchoring effect. The approach above is implemented by chemical microetching to form complex jug-like shapes in a micron scale on the metal surface so as to roughen the shape of the metal surface. When the melted plastic contacts the metal surface, the melted plastic fills recesses amid the minute metal bumps and the plastic is cured amid the minute bumps, such that the approach of plastic bonding achieves an anchoring effect by curing the plastic filled in the minute bumps on the metal surface. The plastic having filled and cured amid the jug-like minute bumps cannot be removed and the bonding principle thereof is physical bonding using the anchoring effect, so that such form is almost not affected by chemical properties of plastic. Given that the melted plastic can fully pressurize and contact the metal surface, the plastic and metal can be mutually bonded on a heterogeneous interface by means of whether insert injection molding, transfer injection molding or hot press molding, thereby preventing air or moisture from leaking through the heterogeneous interface. In this embodiment, the material of the buffer sleeve 30 is implemented by silicone.

In this embodiment, the buffer sleeve 30 may be a soft element in form of a silicone element or a rubber element. The buffer sleeve 30 corresponds to the surrounding wall 24 and is shaped as a ring; however, the present invention is not limited to the examples above. For example, the buffer sleeve 30 may also be shaped as a circle or be shaped according to the shape of the surrounding wall 24. The buffer sleeve 30 envelops the top edge of the surrounding wall 24 and exceeds the first connector 12. By enveloping the surrounding wall 24 in a metal material by the buffer sleeve 30 in a soft material, most of a force of impact can be first absorbed by the buffer sleeve 30 in a soft material in the event of a collision, so as to prevent the first connector 12 in the surrounding wall 24 from damage caused by the force of impact.

Figure 2:
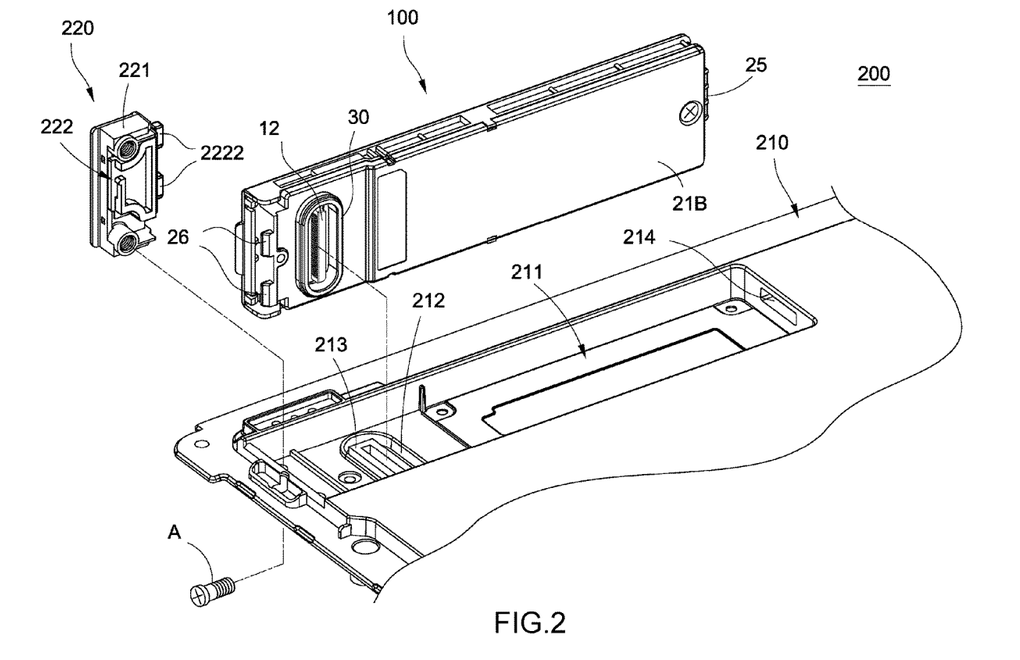
FIG. 2 is an exploded three-dimensional diagram of an electronic device and an external electronic component of the present invention.
Figure 3:
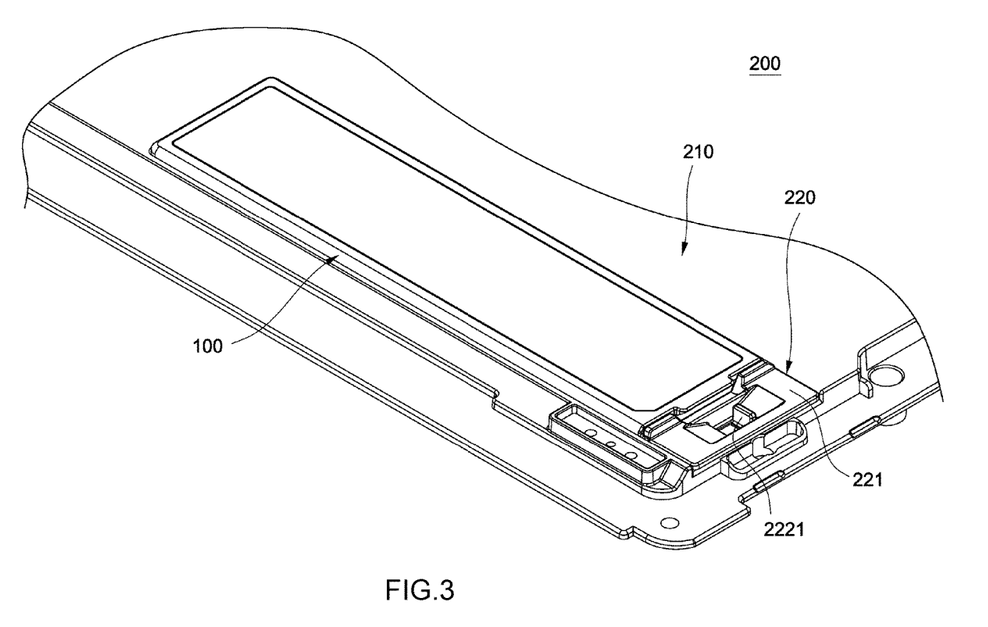
FIG. 3 is a three-dimensional appearance diagram of an electronic device and an external electronic component of the present invention.
Figure 4:
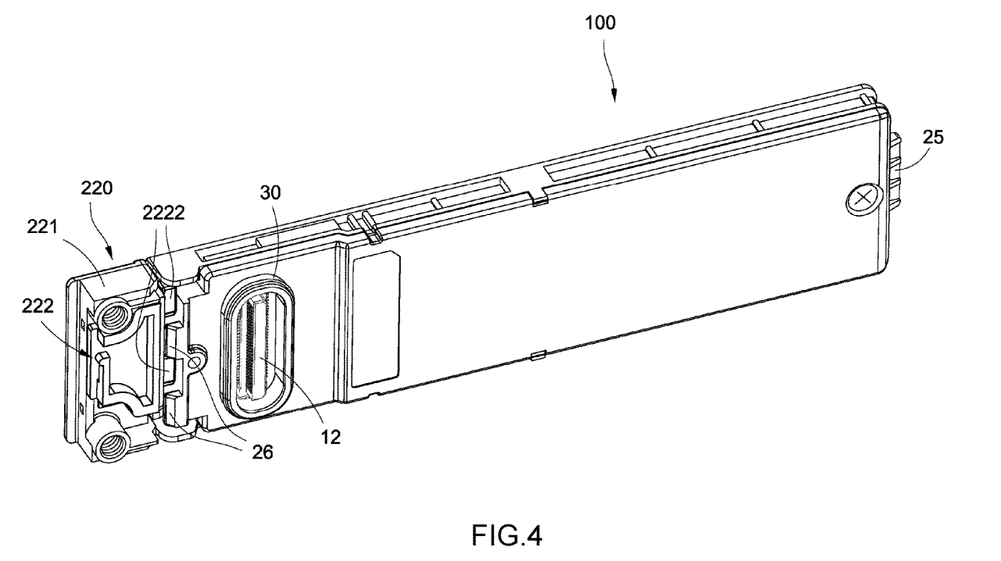
FIG. 4 is a three-dimensional appearance diagram of a mobile latch and an external electronic component of the present invention.

Referring to FIG. 2 and FIG. 3, the present invention further provides an electronic device 200 primarily including a casing 210, a mobile latch 220 and the external electronic component 100 described above.

In this embodiment, the casing 210 may be a plastic element, or a magnesium alloy, magnesium aluminum alloy or aluminum element, and is not particularly defined by the present invention. An accommodating chamber 211 is provided on an outer surface of the casing 210. The accommodating chamber 211 is shaped as a long strip corresponding to the external electronic component 100, the accommodating chamber 211 is provided with an insertion hole 212 therein, and a second connector 213 configured to connect to the first connector 12 is provided in the insertion hole 212. The external electronic component 100 is embedded in the accommodating space 211, such that the first connector 12 is connected to the second connector 213, and at the same time the buffer sleeve 30 in a soft material is pressed, deformed and hence tightly packed in the insertion hole 212 between the surrounding wall 24 having a higher hardness and the insertion hole 212. Thus, the elastic deformation of the buffer sleeve 30 seals the gap between the surrounding wall 24 and the insertion hole 212, hence enabling the first connector 12 and the second connector 213 to achieve good waterproof and dustproof effects of at least IP66. Moreover, with the shock-absorbing design of tightly packing the soft buffer sleeve 30 and the surrounding wall 24 against the insertion hole 212, the first connector 12 and the second connector 213 are effectively prevented from instantaneous signal interruption in between caused directly when a severe impact is received.

Moreover, one end of the housing 20 of the external electronic component 100 away from the first connector 12 is provided with a tenon 25 disposed in a protruding manner, and an inner wall of the accommodating chamber 211 is provided with an indentation 214 corresponding to the tenon 25. The tenon 25 is fitted in the indentation 214 so as to fix one end of the external electronic component 100. Since the buffer sleeve 30 is tightly fitted in the insertion hole 212, the external electronic component 100 can be fittingly secured and does not easily disengage from the accommodating chamber 211; however, the present invention is not limited to the examples above. For example, the external electronic component 100 and the accommodating chamber 211 may also be assembled or removed by means of a barb or snap.

The mobile latch 220 is movably disposed at the casing 210 and is located on one side of the accommodating chamber 211, and the mobile latch 220 is movable so as to stop the external electronic component 100, thereby further preventing the external electronic component 100 from toggling of an external force and hence from disengaging from the accommodating chamber 211. More specifically, the mobile latch 220 includes a base 221 and a toggle 222. The base 221 is fixed at the casing 210 of the electronic device 200, and the toggle 222 is located between the base 221 and the casing 210. One end of the housing 20 of the external electronic component 100 away from the tenon 25 is provided with a first fitting coupling portion 26, and the toggle 222 is provided in a protruding manner with a trigger 2221 and is provided with a second fitting coupling portion 2222 corresponding to the first fitting coupling portion 26. The toggle 222 is driven to move relative to the first fitting coupling portion 26 by toggling the trigger 221, such that the first fitting coupling portion 26 becomes fittingly coupled with the second fitting coupling portion 2222.

Figure 5:
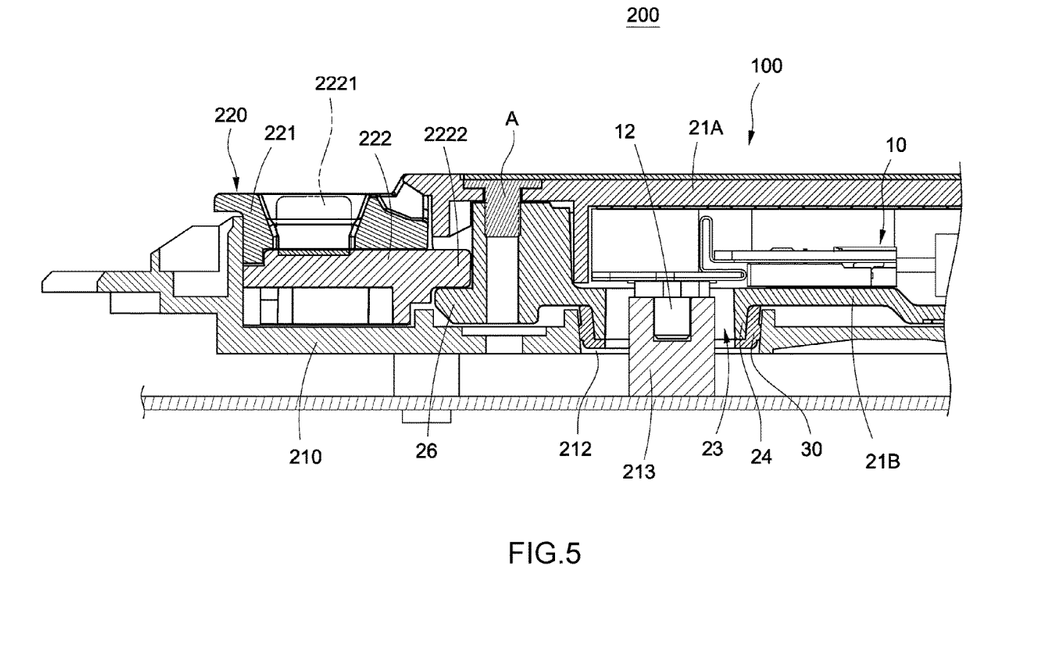
FIG. 5 is a side section view of an electronic device and an external electronic component of the present invention.
Figure 6:
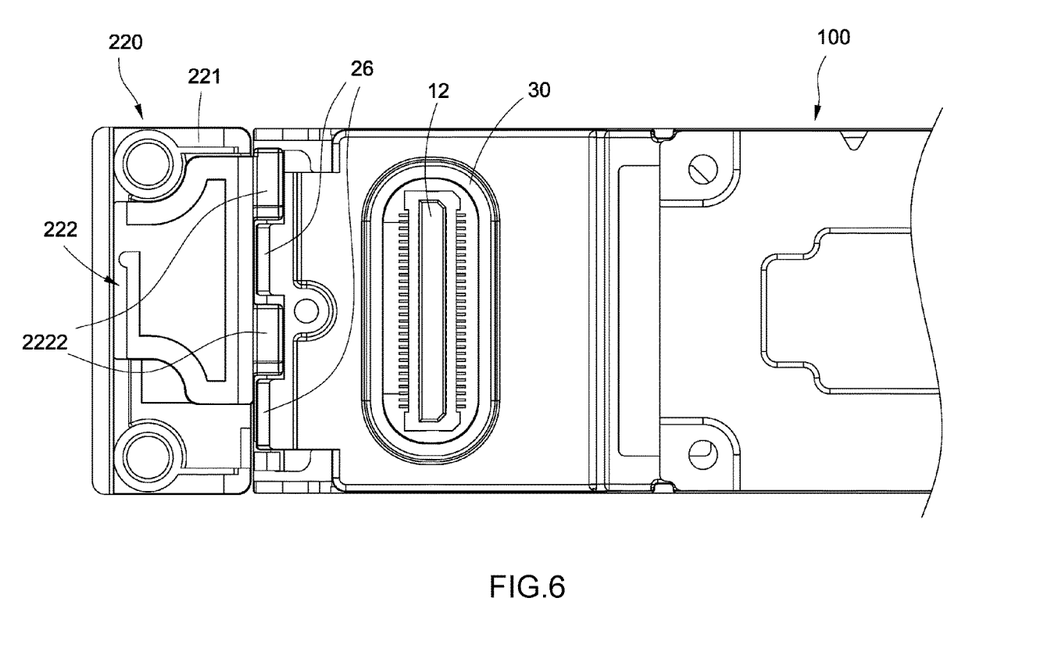
FIG. 6 is a bottom view of a first state of use of a mobile latch and an external electronic component of the present invention.
Figure 7:
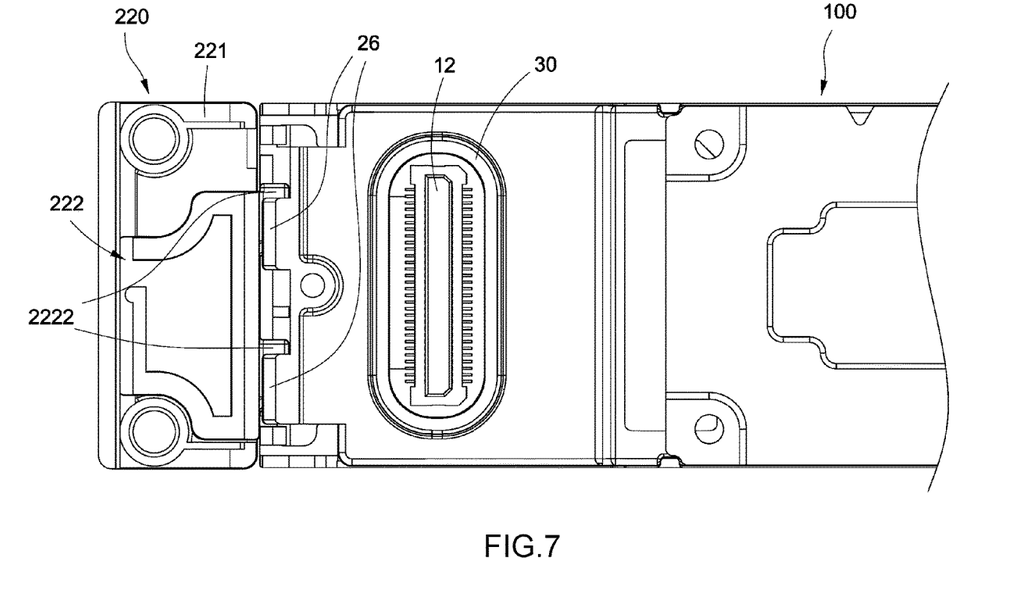
FIG. 7 is a bottom view of a second state of use of a mobile latch and an external electronic component of the present invention.

Referring to FIG. 4 to FIG. 7, in this embodiment, the first fitting coupling portion 26 includes two bumps, and the second fitting coupling portion 2222 also includes two bumps corresponding to the first fitting coupling portion 26. However, the shapes and numbers of the bumps are not specifically defined by the present invention, given that the first fitting coupling portion 26 and the second fitting coupling portion 2222 achieve a mutual fitting coupling effect. Referring to FIG. 5, the two bumps of the second fitting coupling portion 2222 are located above the two bumps of the first fitting coupling portion 26, so as to allow the mobile latch 220 to stop the external electronic component 100. The second fitting coupling portion 2222 of the toggle 222 can be staggered relative to the first fitting coupling portion 26 of the housing 20 of the external electronic component 100 by toggling the trigger 2221, so as to enable a user to take out the external electronic component 100 from the accommodating chamber 211, as shown in FIG. 6. In contrast, the second fitting portion 2222 of the toggle 222 can be fittingly coupled with the first fitting coupling portion 26 of the housing 20 of the external electronic component 10 by toggling the trigger 2221 in a reverse direction, such that the external electronic component 100 is stopped in the accommodating chamber 211 and cannot be taken out, as shown in FIG. 7.

It should be noted that, the assembly method for the electronic device 200 and the external electronic component 100 of the present invention includes the following steps. First of all, the buffer sleeve 30 is sleeved to envelop the top edge of the surrounding wall 24, and then the body 10 of the external electronic component 100 is placed and fitted in the housing 20 to form the external electronic component 100, such that the first connector 10 passes through the notch 23 and enters and is accommodated in the surrounding wall 24 and the buffer sleeve 30. Next, the tenon 25 on one end of the external electronic component 100 is fitted in the indentation 214 of the accommodating chamber 211 of the electronic device 200. The external electronic component 100 is entirely placed in the accommodating chamber 211 of the electronic device 200, and at the same time the surrounding wall 24 is inserted in the insertion hole 212 of the accommodating chamber 211 to guide the first connector 12 and the second connector 213 to connect to each other, and the buffer sleeve 30 is tightly fitted in the insertion hole 212. Lastly, the trigger 2221 of the mobile latch 220 is toggled to fittingly couple the second fitting coupling portion 2222 of the toggle 222 to the first fitting coupling portion 26, thereby stopping the external electronic component 100 in the accommodating chamber 211 of the electronic device 200.

Therefore, a user is enabled, by merely the sense of touch but not vision, to install or remove the external electronic component 100 by means of a barb in or from the accommodating chamber 211 of the electronic device 200. In addition, because one end of the external electronic component 100 is first placed into the indentation 214 using the tenon 25 of the plastic shell 21A and the buffer sleeve 30 on the metal surrounding wall 24 is tightly packed in the insertion hole 212 by means of heterogeneous bonding, the external electronic component 100 is unlikely to fall off once installed in the accommodating chamber 211. Moreover, with the second fitting coupling portion 2222 of the mobile latch 220 stopping the first fitting coupling portion 26 integrally formed at the metal shell 21B, the external electronic component 100 installed at the electronic device 200 can ensure the electrical connection between the first connector 12 and the second connector 213 in a 6-foot falling test, preventing the instantaneous signal interruption between the two when an impact is received.

In conclusion, the invention is industrially applicable and novel, involves an inventive step, and meets the requirements of a patent application. Therefore, a patent application is filed accordingly, and granting the application with patent rights is respectfully requested to ensure rights of the Inventor. The present invention may be implemented by many other possible embodiments. Without departing from the spirit and the substantiveness of the present invention, various changes and modifications may be made by a person skilled in the art on the basis of the disclosure. It should be noted that, such corresponding changes and modifications are to be encompassed with the scope of protection of the appended claims.

What is claimed is:
1. An external electronic component, comprising:
   a body provided with a first connector;

a housing provided with a notch, and a surrounding wall encircling the notch and erected on an outer side of the housing such that the surrounding wall protrudes from the housing in a direction facing away from the body, wherein the body is accommodated in the housing, the first connector passes through the notch to an outside, and the surrounding wall encircles the first connector; and a buffer sleeve enveloping the surrounding wall.

2. The external electronic component according to claim 1, wherein the buffer sleeve envelops a top edge of the surrounding wall and exceeds the first connector.

3. The external electronic component according to claim 1, wherein the buffer sleeve is a silicon material.

4. The external electronic component according to claim 1, wherein the buffer sleeve is a rubber material.

5. The external electronic component according to claim 1, wherein the surrounding wall comprises bumps for anchoring the buffer sleeve.

6. The external electronic component according to claim 1, further comprising:
a shell configured to be detachably coupled to the housing.

7. The external electronic component according to claim 6, wherein the body is configured to be disposed between the shell and the housing.

8. An electronic device, comprising:
a casing provided with an accommodating chamber at an outer surface thereof;
a mobile latch movably disposed at the casing and located on one side of the accommodating chamber; and
an external electronic component, comprising:
a body provided with a first connector;
a housing provided with a notch, and a surrounding wall encircling the notch and erected on an outer side of the housing, wherein the body is accommodated in the housing, the first connector passes through the notch to an outside, and the surrounding wall encircles the first connector; and
a buffer sleeve enveloping the surrounding wall;
wherein, the external electronic component is embedded in the accommodating chamber, and the mobile latch is movable so as to stop the external electronic component.

9. The electronic device according to claim 8, wherein one end of the housing is provided with a first fitting coupling portion, the mobile latch comprises a toggle, the toggle is provided with a second fitting coupling portion corresponding to the first fitting coupling portion, and the toggle is movable relative to the first fitting coupling portion such that the first fitting coupling portion is fittingly coupled to the second fitting coupling portion.

10. The electronic device according to claim 9, wherein the mobile latch further comprises a base, the base is fixed at the casing, the toggle is located between the base and the casing, and the toggle is provided in a protruding manner such that a trigger passes through and out of the base.

11. The electronic device according to claim 9, wherein one other end of the housing is provided with a tenon, an inner wall of the accommodating chamber is provided with an indentation corresponding to the tenon, and the tenon is fitted in the indentation.

12. An assembly method for an external electronic component, comprising:
providing an electronic device, a body and a housing, wherein the electronic device is provided with an accommodating chamber, the accommodating chamber is provided with an insertion hole therein, the insertion hole is provided with a second connector therein, the body is provided with a first connector, and the housing is provided with a notch and a surrounding wall encircling the notch;
enveloping the surrounding wall by a buffer sleeve;
placing the body in the housing to form the external electronic component, and passing the first connector through the notch to enter the surrounding wall; and
placing the external electronic component in the accommodating chamber, guiding the surrounding wall by the buffer sleeve and inserting the surrounding wall in the insertion hole, and connecting the first connector to the second connector.

13. The assembly method for an external electronic component of claim 12, wherein the buffer sleeve envelops a top edge of the surrounding wall and exceeds the first connector.

14. The assembly method for an external electronic component of claim 12, wherein one end of the housing is provided with a first fitting coupling portion, a mobile latch located at one side of the accommodating chamber comprises a toggle, the toggle is provided with a second fitting coupling portion corresponding to the first fitting coupling portion, and the assembly method further comprises:
moving the toggle relative to the first fitting coupling portion so as to fittingly couple the first fitting coupling portion to the second fitting coupling portion.

15. The assembly method for an external electronic component of claim 14, wherein one other end of the housing is provided with a tenon in a protruding manner, an inner wall of the accommodating chamber is provided with an indentation corresponding to the tenon, and in step of placing the body in the housing to form the external electronic component and passing the first connector through the notch to enter the surrounding wall, the tenon is fitted in the indentation before the external electronic component is placed in the accommodating chamber.

16. An electronic device, comprising:
a casing provided with an accommodating chamber on an outer surface thereof, wherein the accommodating chamber is provided with an insertion hole, and the insertion hole is provided with a second connector therein; and
an external electronic component, embedded in the accommodating chamber, the external electronic component comprising a body, a housing and a buffer sleeve, wherein the body is provided with a first connector, the housing is provided with a notch and a surrounding wall corresponding to the first connector, the surrounding wall encircles the notch, the buffer sleeve is adhered to the surrounding wall, and the buffer sleeve is packed in the insertion hole when the first connector is connected to the second connector.

17. An assembly method for assembling an external electronic component to an electronic device, comprising:
providing the electronic device, a body and a housing, wherein the electronic device is provided with an accommodating chamber, the accommodating chamber is provided with an insertion hole therein, the insertion hole is provided with a second connector therein, the body is provided with a first connector, and the housing is provided with a notch and a surrounding wall encircling the notch;
enveloping the surrounding wall by a buffer sleeve;
placing the body in the housing to form the external electronic component, and placing the first connector at the notch; and placing one end of the external electronic component away from the first connector in the accommodating chamber, and connecting the first connector to the second connector, such that the buffer sleeve is packed in the insertion hole.

18. The assembly method for assembling an external electronic component to an electronic device according to claim 17, wherein the surrounding wall protrudes from the housing in a direction facing away from the body after the body is placed in the housing to form the external electronic component.

19. The assembly method for assembling an external electronic component to an electronic device according to claim 17, further comprising:

connecting the housing to a shell to secure the body between the housing and the shell after placing the body in the housing.

20. The assembly method of claim 19, wherein connecting the housing to the shell comprises inserting a screw bolt through the housing and the body to threadedly connect the housing to the shell.

\* \* \* \* \*